United States Patent [19]
Sakata

[11] Patent Number: 5,648,978
[45] Date of Patent: Jul. 15, 1997

[54] OSCILLATION POLARIZATION MODE SELECTIVE SEMICONDUCTOR LASER, MODULATION METHOD THEREFOR AND OPTICAL COMMUNICATION SYSTEM USING THE SAME

[75] Inventor: Hajime Sakata, Atsugi, Japan

[73] Assignee: Canon Kabushiki Kaisha, Tokyo, Japan

[21] Appl. No.: 579,730

[22] Filed: Dec. 28, 1995

[30] Foreign Application Priority Data

Jan. 4, 1995 [JP] Japan .................................. 7-015540
Jan. 4, 1995 [JP] Japan .................................. 7-015542

[51] Int. Cl.$^6$ .............................. H01S 3/19; H01S 3/10; H04B 10/00; G02B 6/26
[52] U.S. Cl. ........................... 372/50; 372/27; 372/96; 385/37; 385/41; 359/156; 359/181
[58] Field of Search ........................... 372/50, 96, 27; 385/41, 42, 37; 359/124, 156, 122, 173, 192, 181

[56] References Cited

U.S. PATENT DOCUMENTS

| | | | |
|---|---|---|---|
| 4,054,363 | 10/1977 | Suematsu | 372/50 |
| 5,066,086 | 11/1991 | Angenent et al. | 385/41 |
| 5,117,469 | 5/1992 | Cheng et al. | 385/11 |
| 5,220,573 | 6/1993 | Sakata et al. | 372/50 |
| 5,444,730 | 8/1995 | Mizutani | 372/50 |
| 5,497,390 | 3/1996 | Tanaka et al. | 372/50 |
| 5,517,589 | 5/1996 | Takeuchi | 385/37 |

FOREIGN PATENT DOCUMENTS

| | | |
|---|---|---|
| 62-144426 | 12/1987 | Japan . |
| 1055889 | 6/1989 | Japan . |
| 02-159781 | 6/1990 | Japan . |
| 2159781 | 9/1990 | Japan . |

OTHER PUBLICATIONS

M. Suzuki, et al., "λ/4–Shifted DFB Laser/Electroabsorbtion Modulator Integrated Light Source", IEICE Technical Report, vol. 90, No. 78, Jun. 18, 1990.

M.J. Chauki, et al., "1.5 Gbit/s FSK Transmission System Using Two Electrode DFB Laser As A Tunable FSK Discriminator/Photodetector", Electronics Letters, vol. 26, No. 15, pp. 1146–1148, Jul. 19, 1990.

Hidenao Tanaka et al., "Highly Efficient TE/TM Mode Switching Of GaAsP/A1 GaAs Strained Quantum–Well Laser Diodes", Applied Physics Letters, vol. 64, No. 2, Jan. 10, 1994, pp. 158–160.

I. Kim et al., "Broadly Tunable Vertical–Coupler Filtered Tensile Strained InGaAs/InGaAsP Multiple Quantum Well Laser", Applied physics letters, vol. 64, No. 21, May 23, 1994. pp. 2764–2766.

F. Heismann, et al., "Polarization–Independent Wavelength Filter Using a Grating–Assisted Vertical Directional Coupler in InP", Proceedings of the European Conf. on Optical Communication, vol. 3, Sep. 12, 1993, pp. 69–72.

S. Illek et al. "Codirectionally Coupled Twin–Guide Laser Diode For Broadband Electronic Wavelength Tuning", Electronics Letters, vol. 27, No. 24, Nov. 21, 1991, pp. 2207–2209.

*Primary Examiner*—Rodney B. Bovernick
*Assistant Examiner*—Luong-Quyen T. Phan
*Attorney, Agent, or Firm*—Fitzpatrick, Cella, Harper & Scinto

[57] ABSTRACT

A semiconductor laser includes a semiconductor laser structure having an active layer. The laser structure is designed such that light in both of two polarization modes can be excited therein. First and second reflectors are provided, and at least one of them is a distributed reflector which determines first and second reflection wavelengths for the two polarization modes. A coupling unit is provided for coupling the laser structure and the first and second reflectors for either of the light of the two polarization modes at first and second coupling wavelengths, which respectively coincide with the first and second reflection wavelengths. One of the light of the two polarization modes at the first and second reflection wavelengths is selectively propagated along a cavity comprised of the laser structure and the first and second reflectors by a control unit. Thus, light oscillates in one of the two polarization modes at the first and second reflection wavelengths.

25 Claims, 7 Drawing Sheets

OSCILLATION POLARIZATION MODE SELECTIVE SEMICONDUCTOR LASER, MODULATION METHOD THEREFOR AND OPTICAL COMMUNICATION SYSTEM USING THE SAME

BACKGROUND OF THE INVENTION

1. Field of the Invention

The present invention relates to a semiconductor laser for use in the fields of optical communication systems, such as optical local area (LAN) networks, optical information processing, optical recording and the like, a modulation method for modulating or driving the semiconductor laser and an optical communication system using the semiconductor laser as a transmitter, for example. More in particular, the present invention relates to an oscillation polarization mode selective semiconductor laser whose oscillation polarization mode can be switched between mutually-perpendicular polarization modes and which can suppress dynamic wavelength fluctuation even during high-speed modulation time and stably achieve high-density frequency or wavelength division multiplexing (FDM or WDM) optical communication and the like.

2. Related Background Art

In recent years, increased transmission capacity in the field of optical communications has become desirable, and the development of optical frequency or wavelength division multiplex communication, in which signals at a plurality of optical frequencies or wavelengths are multiplexed in a single optical fiber, has been advanced.

It is important to narrow the wavelength or frequency interval between multiplexed signals to increase the transmission capacity as much as possible. For this purpose, it is desirable that the transmission bandwidth of a wavelength tunable filter or demultiplexer is small and the occupied frequency bandwidth or spectral line width of a laser used as a light source is narrow. In a distributed feedback (DFB) filter whose tunable bandwidth is 3 nm, for example, since the transmission bandwidth is about 0.03 nm, multiplexing of 100 channels is possible. In this case, however, the spectral line width is required to be less than 0.03 nm. At present, even the spectral line width of a DFB laser, which is also known as a dynamic single mode semiconductor laser, is widened to about 0.3 nm due to the dynamic wavelength fluctuation when a direct amplitude shift keying (ASK) modulation is performed to the single mode semiconductor laser. Therefore, this kind of laser is unsuitable for the FDM or WDM transmission.

Therefore, to reduce such wavelength fluctuation, a system using an external intensity modulator (see Suzuki et al., "λ/4 Shift DFB Laser/Light Source Integrated With Absorption Type Optical Modulator", Report in Symp. of Japan Electronics Information Communication Academy, OQE 90-45, p. 99, 1990, for example), a direct FSK modulation system (see M. J. Chawski et al. "1.5 Gbit/s FSK Transmission System Using Two Electrode DFB Laser As A Tunable FSK Discriminator/Photodetector", Electron. Lett. Vol. 26 No. 15, 1990, for example), a direct polarization modulation system (see Japanese Patent Laid-open No. 2 (Heisei)-159781, for example) have been proposed.

In an external intensity modulator, wavelength fluctuation is about 0.03 nm, which is the marginal value that can satisfy the required spectral linewidth, and the number of devices is high, leading to an increase in cost. In an FSK system, a filter on the receiver side is required to function as a wavelength discriminator and thus, sophisticated control techniques are needed.

However, in a direct polarization modulation system, only a plural number of electrodes of an ordinary DFB laser are needs. Also, the number of devices is less, and the wavelength fluctuation is smaller, than that of an external modulation system. Further, receiver filter requirements are less demanding since the transmission signal is ASK.

As described above, a polarization modulation system is a modulation system suitable for wavelength division multiplexing transmission and the like. In that system, however, a positive means for enabling the polarization-mode switching is not disclosed. Therefore, a highly reproducible device is difficult to fabricate, and adjustment is needed after its fabrication, leading to a poor yield.

SUMMARY OF THE INVENTION

It is an object of the present invention to provide a semiconductor laser for use in the fields of optical communication systems such as optical local area (LAN) networks, optical information processing, optical recording and the like, a modulation method for driving the semiconductor laser and an optical communication method and system using the semiconductor laser.

The object of the present invention is achieved by the following semiconductor lasers, optical communication methods and systems.

One aspect of the present invention provides a semiconductor laser having a distributed feedback semiconductor laser structure. The laser structure has an active layer and is designed so that light in both of two mutually-perpendicular polarization modes can be excited. The laser also includes first and second reflectors, at least one of which is a distributed reflector which determines first and second reflection wavelengths for the two mutually-perpendicular polarization modes, and a unit for coupling the laser structure and the first and second reflectors for either light of the two mutually-perpendicular polarization modes at first and second coupling wavelengths. The first and second coupling wavelengths respectively coincide with the first and second reflection wavelengths, so that either light of the two mutually-perpendicular polarization modes at the first and second reflection wavelengths is selectively propagated along a cavity comprised of the semiconductor laser structure and the first and second reflectors. The laser includes further a unit for controlling the coupling unit such that the coupling unit selects one of the two mutually-perpendicular polarization modes at the first and second coupling wavelengths to cause light to oscillate in one of the two mutually-perpendicular polarization modes at the first and second reflection wavelengths.

The following laser structures may be used. The first reflector may be a distributed feedback grating reflector and the coupling unit may be a directional coupler. The second reflector may be a reflective facet. The distributed feedback grating reflector may include the active layer. The directional coupler may be made of a pair of asymmetrical waveguides. For example, the thicknesses, widths or compositions of the waveguides are asymmetrical. One of waveguides of the directional coupler may be a W-shaped waveguide in which a core layer is surrounded by a clad layer whose refractive index is lower than the refractive index of an entire clad layer of the semiconductor laser. The directional coupler may instead be a grating, and the coupling of propagation modes between the laser structure and the first and second reflectors is assisted by the grating. The laser may further include another control unit for controlling current injected into the distributed feedback grating reflector to change the reflection wavelength. Gains for the two polarization modes in the cavity may be set approximately equal near the feedback or reflection wavelength of the distributed feedback grating reflector. The active layer may be a layer of a multiple quantum well structure into which a tensile strain is introduced and in which a light-hole in a valence band is substantially equal to level a heavy-hole level in the valence band.

Further, at least one of the first and second reflectors may be a distributed Bragg reflector and the coupling unit may be an active directional coupler which includes the active layer. The first and second reflectors may both be distributed Bragg reflectors. Alternatively, the first reflector may comprise a distributed Bragg reflector and the second reflector may comprise a reflective facet. The active directional coupler may include an active layer and a waveguide layer. The active directional coupler may include a grating, and the coupling of propagation modes between the laser structure and the first and second reflectors is assisted by a phase matching by the grating.

Another aspect of the present invention provides an optical communication method or system for transmitting a signal from a transmitter to a receiver through an optical transmission line, wherein the polarization mode of output light from the above semiconductor laser is modulated between two mutually-perpendicular polarization modes or transverse electric (TE) and transverse magnetic (TM) polarization modes by controlling current injected into the semiconductor laser, and only the output light in one of the TE mode and the TM mode is selected by selecting means to create an amplitude-modulated signal. The amplitude-modulated signal is transmitted through the optical transmission line.

The wavelength of the amplitude-modulated signal may be tuned by the semiconductor laser, and a signal at a desired wavelength may be selectively detected by using a wavelength filter in the receiver. Semiconductor lasers and wavelength filters may be used to detect selectively signals at respective desired wavelengths to perform wavelength division multiplexing optical communication.

These advantages and others will be more readily understood in connection with the following detailed description of the preferred embodiments in conjunction with the drawings.

DESCRIPTION OF THE PREFERRED EMBODIMENTS

First Embodiment

Figure 1:
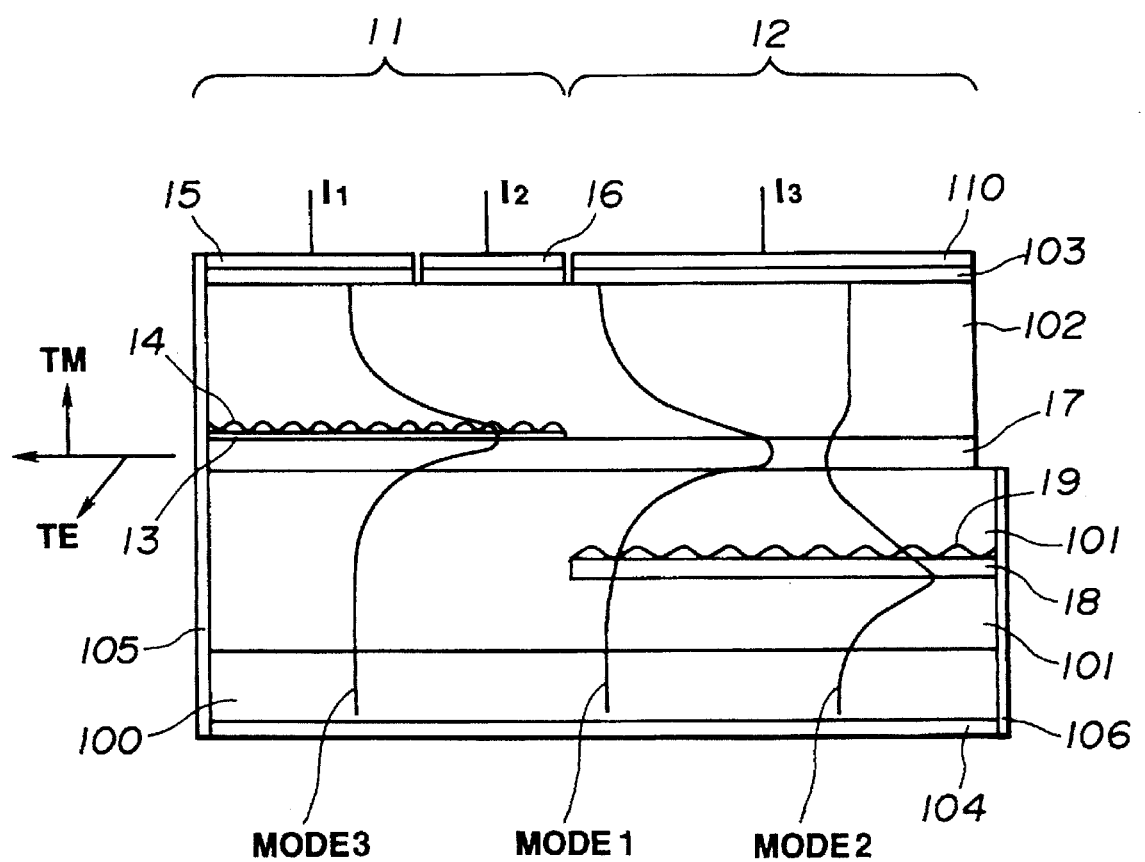
FIG. 1 is a cross-sectional view illustrating a first embodiment of an oscillation polarization mode selective semiconductor laser according to the present invention.

A first embodiment of the present invention will be described with reference to FIG. 1.

A semiconductor laser of this embodiment has a distributed feedback grating region 11 and a directional coupler region 12. In the distributed feedback grating region 11, an active layer 13 is layered and a grating 14 of a fine pitch is formed at a place where a modal field of mode 3 overlaps, so that only a predetermined wavelength (a distributed feedback wavelength) is reflected. A distributed feedback wavelength $\lambda_{DFB}$ is represented by $\lambda DFB=2N_{eff}\Lambda_{DFB}$ where $N_{eff}$ is the effective refractive index for mode 3, and $\Lambda_{DFB}$ is the pitch of the grating 14. The wavelength $\lambda_{DFB}$ is changed by currents injected through electrodes 15 and 16.

In the directional coupler region 12, waveguide layers 17 and 18 are layered, and two modes, whose central intensities respectively lie at the waveguide layers 17 and 18, can be built. A grating 19 of a relatively coarse pitch is formed at a place where modal fields of mode 1 and mode 2 overlap. In a right-hand end portion of the waveguide layer 17 in the directional coupler region 12, a slant cut is formed such that no reflection occurs, or impurity is doped such that light absorption is strengthened thereat. The mode 1 will strongly couple to the mode 3 in the distributed feedback grating region 11, and the mode 2 will very weakly couple to the mode 3 except at wavelength which satisfies the Bragg condition of the grating 19 of a relatively coarse pitch. A coupling wavelength $\lambda_{DC}$ is represented by $\lambda_{DC}=|N_{eff}^{(1)}-N_{eff}^{(2)}|\Lambda_{DC}$, where $N_{eff}^{(1)}$ and $N_{eff}^{(2)}$ are respectively effective refractive indices for mode 1 and mode 2 and $\Lambda_{DC}$ is the pitch of the grating 19.

In a semiconductor laser having an asymmetric structure with respect to longitudinal and lateral directions, two modes exist; one is a transverse electric (TE) mode whose electric field is parallel to a substrate plane and the other is a transverse magnetic (TM) mode whose electric field is perpendicular thereto. The coupling wavelength $\lambda_{DC}$ differs between two mutually-perpendicular polarization modes. The coupling wavelength $\lambda_{DC}$ is can be switched between $\lambda_{DC}$ for the TE mode and $\lambda_{DC}$ for the TM mode by controlling current injected through the electrode 110 in the directional coupler region 12.

However, the distributed feedback wavelength $\lambda_{DFB}$ in the distributed feedback grating region 11 varies slightly depending on the polarization mode, but the difference between the TE mode and the TM mode is small. When current is injected into the distributed feedback grating region 11, the gain of the active layer 13 increases. In this state, when the polarization mode (the TE mode or the TM mode) coupling to the directional coupler region 12 is switched (i.e, the coupling wavelength $\lambda_{DC}$ of the coupling polarization mode is accorded to the feedback wavelength $\lambda_{DFB}$), only light transferred between the waveguides 17 and 18 is reflected at the reflective end surface or facet 106 of the waveguide layer 18 and fed back to the distributed feedback grating region 11 to become laser oscillation light. Since appropriate means (for example, the slant cut) is provided at the end surface portion of the upper waveguide layer 17 on the side of the directional coupler region 12, no light in mode 1 is reflected to return to the distributed feedback grating region 11.

In the above-discussed structure, oscillation wavelength and switching of the polarization mode can be independently controlled in the distributed feedback grating region 11 and in the directional coupler region 12, respectively, so that the polarization modulation can be performed stably even during wavelength tuning.

In FIG. 1, reference numeral 100 designates an n-type InP substrate. Reference numeral 101 designates an n-type InP clad layer. Reference numeral 18 designates the above-described n-type InGaAsP waveguide layer which forms the directional coupler. Reference numeral 19 designates the above-described grating for assisting the directional coupler. Reference numeral 17 designates the above-described undoped InGaAsP waveguide layer which is common to the two regions 11 and 12. Reference numeral 13 designates the above active layer of a strained super-lattice structure which consists ten pairs of undoped $In_{0.53}Ga_{0.47}As$ layers (thickness is 5 nm) and $In_{0.28}Ga_{0.72}As$ layers (thickness is 5 nm). Reference numeral 14 designates the above-described fine grating for performing distributed coupling in a reverse direction. Reference numeral 102 designates a p-type InP clad layer. Reference numeral 103 designates a p-type $In_{0.59}Ga_{0.41}As_{0.9}P_{0.1}$ contact layer. Reference numerals 15, 16 and 110 respectively designate the above-described Cr/AuZnNi/Au electrode layers which are separated by separation grooves formed by removing the contact layer 103. Reference numeral 104 designates an n-side common electrode. Reference numeral 105 designates an anti-reflection layer. Reference numeral 106 designates the above-described reflector of a highly-reflective layer. The active layer 13 is a layer of a tensile strained multiple quantum well structure, and transition energy between the level of heavy holes in the valence band and the ground level of electrons in the conduction band ($E_{hh0}-E_{e0}$) is made equal to transition energy between the level of light holes in the valence band and the ground level of electrons in the conduction band ($E_{lh0}-E_{e0}$). Therefore, when compared with an ordinary DFB laser, an oscillation threshold for the TM mode (which corresponds to the transition energy ($E_{lh0}-E_{e0}$)) is low and the oscillation polarization mode switching between the TE mode and the TM mode can be effectively performed by properly controlling the current injected into the device.

In the structure of the laser shown in FIG. 1, wavelength corresponding to the transition energy ($E_{lh0}-E_{e0}$) is 1.56 μm (TM mode), and wavelength corresponding to the transition energy ($E_{hh0}-E_{e0}$) is also 1.56 μm (TE mode). Oscillation spectra for the TE mode and the TM mode approximately overlap, and the pitch of the grating 14 is set to 0.24 μm such that the distributed feedback wavelength of the grating 14 is substantially equal to the gain central wavelength. Distributed wavelengths 21 and 22 (see FIG. 2) for the TE mode and the TM mode in the distributed feedback grating region 11 are both close to the wavelength of 1.56 μm, but those distributed wavelengths vary slightly depending on the structure of the device, such as the lateral confinement structure of the waveguide 17 and the layer composition. The variation in distributed wavelengths range between only 3 nm to 6 nm.

Figure 2A:
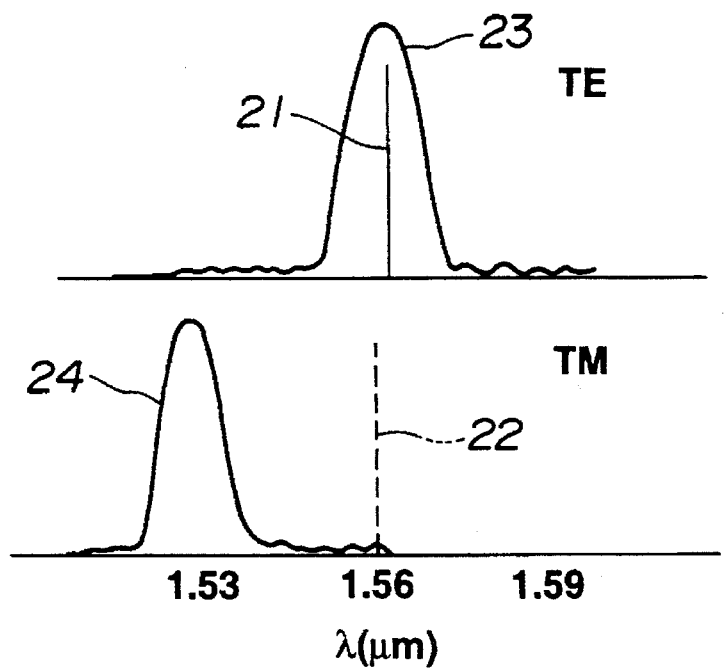
FIGS. 2A and 2B are respectively illustrations showing the principle of operation of the first embodiment of the present invention.
Figure 2B:
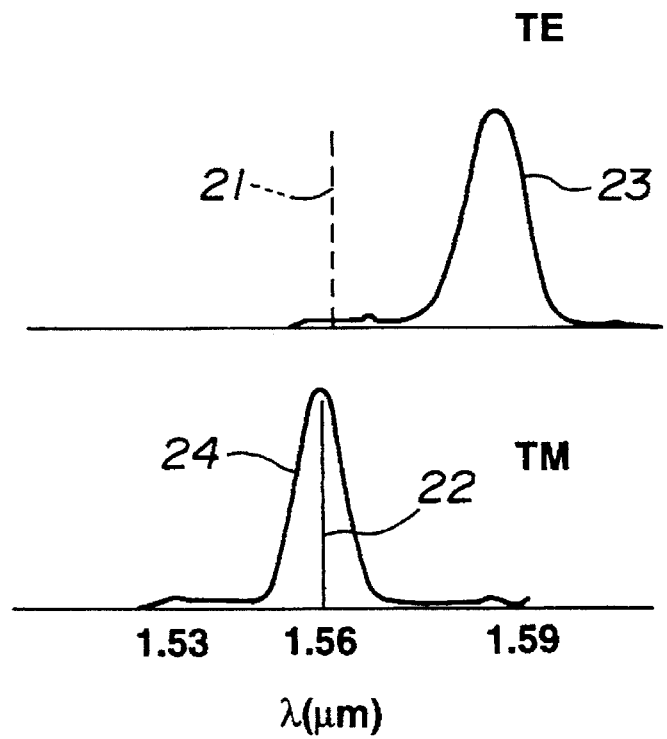

The coupling wavelength of the directional coupler, due to the presence of the coarse grating 19, is very sensitive to the polarization mode, and the coupling wavelengths for the TE mode and the TM mode are ordinarily different from each other by about 30 nm. Therefore, when current injected through the electrode 110 is adjusted such that the coupling wavelength 23 for the TE mode in the directional coupling region 12 includes the feedback wavelength 21 (here, 1.56 μm) in the distributed feedback grating region 11 as illustrated in FIG. 2A, the coupling wavelength 24 for the TM mode necessarily approaches 1.53 μm.

When currents are injected through the electrodes 15 and 16, the active layer 13 is excited and spontaneous emission light occurs. Only a component in the TE mode is selectively coupled to the directional coupling region 12, and only the component in the TE mode of the spontaneous emission light is reflected at the highly-reflective end 106 and returned to the distributed feedback grating region 11. In the distributed feedback grating region 11, strong reflection occurs at the feedback wavelength, and consequently oscillation in the TE mode occurs at the feedback wavelength determined by the distributed feedback grating region 11. Alternatively, when the injection current into the directional coupler region 12 is changed so that the coupling wavelength 24 for the TM mode is coupled to the feedback wavelength 22 for the TM mode in the distributed feedback grating region 11 as illustrated FIG. 2B, laser oscillation in the TM mode similarly occurs. Thus, switching between the TE mode and the TM mode is performed by controlling the current injected through the electrode 110.

In this embodiment, the lower waveguide 18 is removed in the distributed feedback grating region 11. However, since the waveguides 17 and 18 would not be coupled to each other without the presence of the grating 19, the lower waveguide 18 may be left in the distributed feedback grating region 11 if the grating 19 is formed only in the directional coupler region.12.

Figure 3:
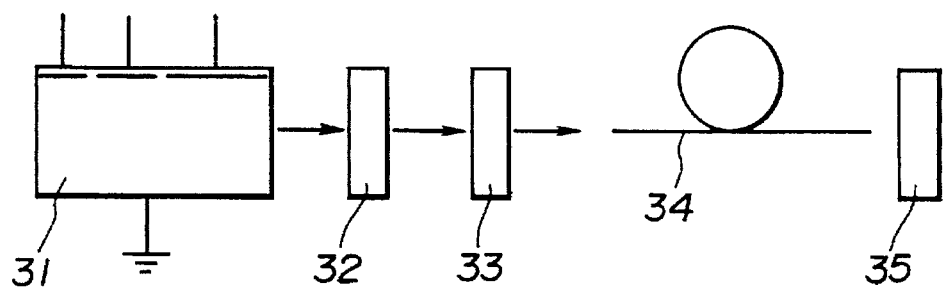
FIG. 3 is a block diagram illustrating an optical communication system in which an oscillation polarization mode selective semiconductor laser of the present invention is used.

FIG. 3 illustrates an optical transmission system in which an intensity-modulated signal is transmitted using a semiconductor laser of the present invention and received on a receiver side. As shown in FIG. 3, a light output from a semiconductor laser 31 is input into a polarizer 32, and only a component in the TE mode (or the TM mode) is selected by the polarizer 32. Thus, an intensity-amplitude signal can be obtained with a high extinction ratio. In the system, mode switching between the TE mode and the TM mode is performed, but the intensity of the output light from the laser 31 hardly fluctuates since the transition energies ($E_{lh0}-E_{e0}$) and ($E_{hh0}-E_{e0}$) are designed to be equal to each other. Therefore, chirping due to carrier fluctuation in the active layer 13 is exceedingly small. The light in the TE mode picked out by the polarizer 32 is coupled to an optical fiber 34 through an isolator 33 and transmitted therethrough. The transmitted light is detected by a photodetector 35. Here, the extinction ratios for the TE mode and the TM mode can be more than 20 dB, and ASK transmission with the same extinction ratio can be established.

The chirping is very small when the semiconductor laser of the present invention is polarization-modulated. The wavelength fluctuation is less than 0.03 nm when only the output in the TE mode is observed. Further, the modulation hand range of the polarization modulation is over 1 GHz.

Figure 4:
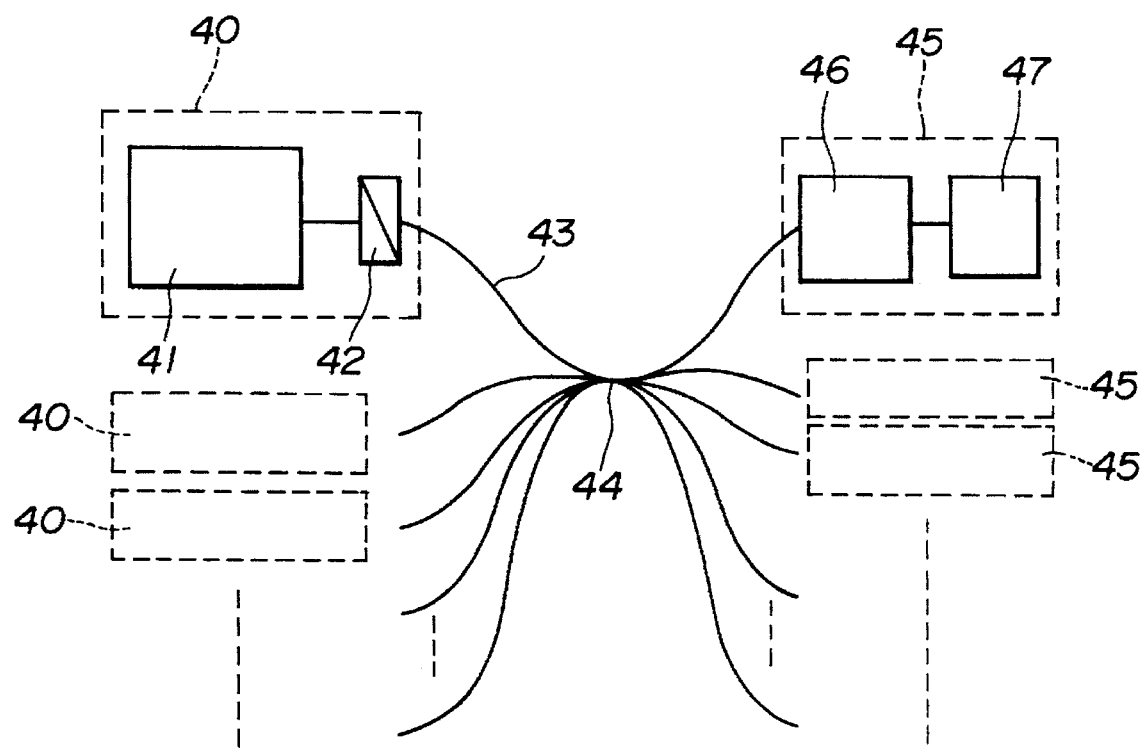
FIG. 4 is a block diagram illustrating another optical communication system in which an oscillation polarization mode selective semiconductor laser of the present invention is used.

FIG. 4 illustrates an example in which optical transmission is conducted using the semiconductor laser of the present invention. In FIG. 4, reference numeral 41 designates a semiconductor laser in which wavelength change and extinction ratio are stably controlled and oscillation polarization mode is modulated according to the present invention. In the semiconductor laser 41, oscillation wavelength can be varied in a range of 3 nm with wavelength interval of about 6 GHz (about 0.05 nm). This is performed by controlling currents injected through the electrodes 15 and 16 (see FIG. 1). In the polarization modulation, dynamic wavelength fluctuation (chirping), which is large in the case of ordinary direct intensity modulation, is very small, for example less than 2 GHz, so that no crosstalk between adjacent channels occurs even when wavelength multiplexing is conducted with intervals of 6 GHz. Therefore, when this semiconductor laser is used, wavelength multiplexing with approximately 60(=3/0.05) channels is possible.

The semiconductor laser 41 together with a polarization beam splitter 42 constructs an optical transmitter apparatus 40. Light emitted from the optical transmitter apparatus 40 is coupled to an optical fiber 43 and transmitted therethrough. In an optical receiver apparatus 45, light of desired wavelength channel is selectively demultiplexed from signal light transmitted through a fiber coupler 44 by an optical filter 46, and the signal is detected by a photodetector 47. Here, a device having the same structure as a DFB laser is used as the optical filter 46, and the filter 46 is excited by a bias current less than its threshold current. The transmission wavelength can be change with a const of 3 nm with a constant transmission gain of 20 dB by changing the ratio between currents injected through the two electrodes. The 10 dB-down transmission width of the filter 46 is 0.03 nm, and this value is satisfactory for the wavelength multiplexing with the interval of 0.05 nm. As the optical filter 46, devices having similar wavelength transmission width, such as a Max-Zehnder type filter and a Fahry-Perot type filter, can be used.

Second Embodiment

Figure 5:
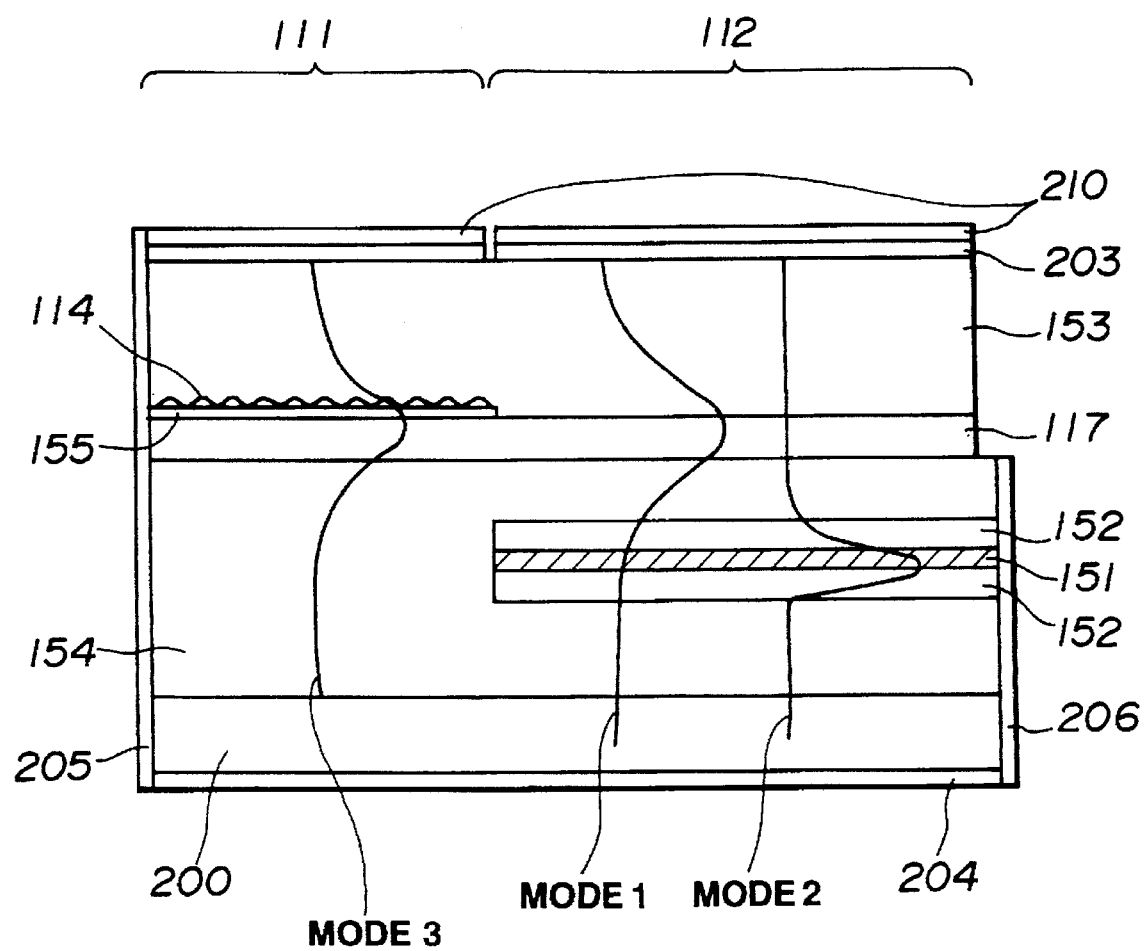
FIG. 5 is a cross-sectional view illustrating a second embodiment of an oscillation polarization mode selective semiconductor laser according to the present invention.

FIG. 5 shows a second embodiment of the present invention. A distributed feedback grating region 111 has a structure similar to the first embodiment, but no grating is formed in a directional coupler region 112. A lower waveguide is formed as a W-shaped waveguide to have wavelength selectivity or polarization mode selectivity. In the W-shaped waveguide, a clad layer 152 around a core layer 151 has a lower refractive index than an entire clad layer 154 of the semiconductor laser, differently from an ordinary step-type waveguide (for example, such as a waveguide 117). As a result, the wavelength dispersion of propagation mode 2 is greatly different from that of the step-type waveguide, and a wavelength, at which modes 1 and 2 are synchronized or phase-matched, is limited, leading to a strong wavelength selectivity. In this structure, the degree of freedom in a bandwidth of coupling wavelength (see coupling wavelengths 23 and 24 in FIG. 2) is small, compared with the grating-assisted type discussed in the first embodiment. Nevertheless, emission loss due to the presence of the grating is low, and high efficiency can be attained. The principle of operation is similar to that of the first embodiment.

A grating layer 114 in the distributed feedback grating region 111 and the waveguide 117 common to the two regions 111 and 112 are similar to those of the first embodiment, but the active layer, lower waveguide and clad layer are different from those of the first embodiment. Specifically, the active layer 155 is comprised of InGaAs which is symmetrical with respect to longitudinal and lateral directions, and the active layer 155 has similar gains for the TE mode and the TM mode. Further, the layer 151 is an n-type InGaAs core layer constructing the W-shaped waveguide, the layer 152 is an n-type InP clad layer whose refractive index is lower than the layers 153 and 154, the layer 153 is a p-type InGaAsP clad layer, and the layer 154 is an n-type InGaAsP clad layer.

Reference numeral 200 designates a substrate. Reference numeral 203 designates a p-type contact layer. Reference numerals 204 and 210 respectively designate an n-side common electrode and p-side electrode layers, the p-side electrode layers 210 being separated by a separation groove formed by removing the contact layer 203. Reference numeral 205 designates an anti-reflection layer. Reference numeral 206 designates a reflector of a highly-reflective layer or reflective facet.

The lower waveguide is formed solely in the directional coupler region 112 such that no coupling occurs in the distributed feedback grating region 111. The pitch and the like of the grating 114 in the distributed feedback grating region 111 are similar to those of the first embodiment. Similar to the first embodiment, polarization mode switching between the TE mode and the TM mode and wavelength control can be performed by controlling currents injected into the two regions 111 and 112. The second embodiment also can be used in optical communication systems as illustrated in FIGS. 3 and 4, similar to the first embodiment.

Third Embodiment

A third embodiment of the present invention will be described with reference to FIGS. 6 and 7.

Figure 7A:
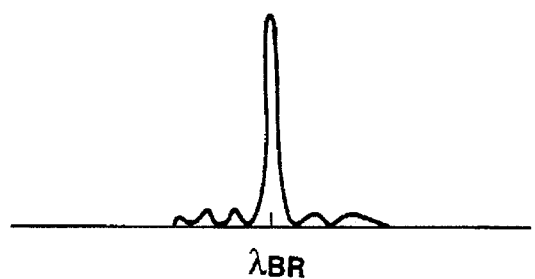
FIGS. 7A, 7B and 7C are respectively illustrations showing the principle of operation of the third embodiment of the present invention.

A semiconductor laser of this embodiment has distributed Bragg reflector regions 211 and 212 (one of them may be a reflective end face) and an active directional coupler region 213 (this region includes an active layer). In the distributed Bragg reflector regions 211 and 212, a grating 216 of a fine pitch is formed on a grating layer 215 layered on a waveguide layer 214 such that only a predetermined wavelength $\lambda_{BR}$ (Bragg wavelength) is reflected in the distributed Bragg reflector regions 211 and 212 as illustrated in FIG. 7A. The Bragg wavelength $\lambda_{BR}$ reflected by the grating 216 slightly varies depending on the polarization mode, but the difference is quite small.

Figure 7B:
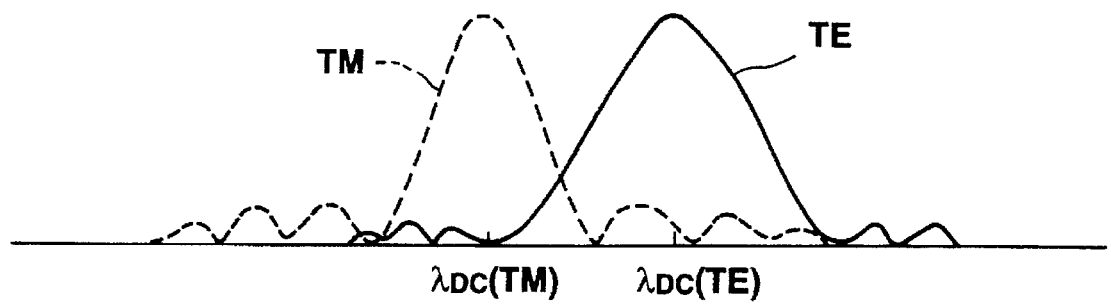
Figure 7C:
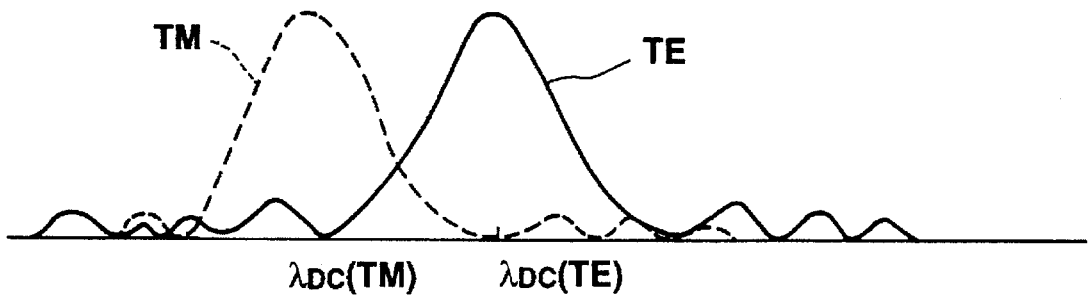

In the active directional coupler region 213, the grating layer 215 is formed on the waveguide layer 214, and an active layer 217 is formed. In the active directional coupler region 213, since compositions and layer thicknesses are different between the active layer 217 and the waveguide layer 214, phase matching between propagation modes is satisfied only at a predetermined coupling wavelength $\lambda_{DC}$. Thus, coupling occurs between two propagation modes which respectively have their central intensities at the active layer 217 and the waveguide layer 214. For the two mutually-perpendicular polarization modes (TE mode and TM mode), the coupling wavelengths $\lambda_{DC}$ differ as illustrated in FIGS. 7B and 7C. The coupling wavelength $\lambda_{DC}$ is changed by controlling current injected through an electrode 304 in the active directional coupler region 213. At one time, as illustrated in FIG. 7B, $\lambda_{DC}$ for the TM mode is made equal to the Bragg wavelength $\lambda_{BR}$ reflected in the Bragg reflector regions 211 and 212, while at another time, as illustrated in FIG. 7C, $\lambda_{DC}$ for the TE mode is made equal to the Bragg wavelength $\lambda_{BR}$.

In the active directional coupler region 213, only the polarization mode transferred from the waveguide layer 214 to the active layer 217 is amplified, and this mode is resonated between the Bragg reflector regions 211 and 212 (or reflective end face), leading to laser resonance. This polarization mode is switched between the TE mode and the TM mode by controlling current injected into the active directional coupler region 213.

When current is injected into the Bragg reflector regions 211 and 212, effective refractive index of the waveguide layer 214 is varied and the Bragg wavelength $\lambda_{BR}$ is changed. The bandwidth of the coupling wavelength in the active directional coupler region 213 is much wider than the bandwidth of the Bragg reflector wavelength by more than two orders of magnitude. Therefore, even if oscillation wavelength is varied in the Bragg reflector regions 211 and 212, the coupling condition in the active directional coupler region 213 can be satisfied sufficiently.

In the above-discussed structure, the oscillation wavelength and the polarization mode selection can be independently controlled in the Bragg reflector regions 211 and 212 and in the active directional coupler region 213, respectively. As a result, the polarization modulation can be stably performed even during wavelength tuning time.

Figure 6:
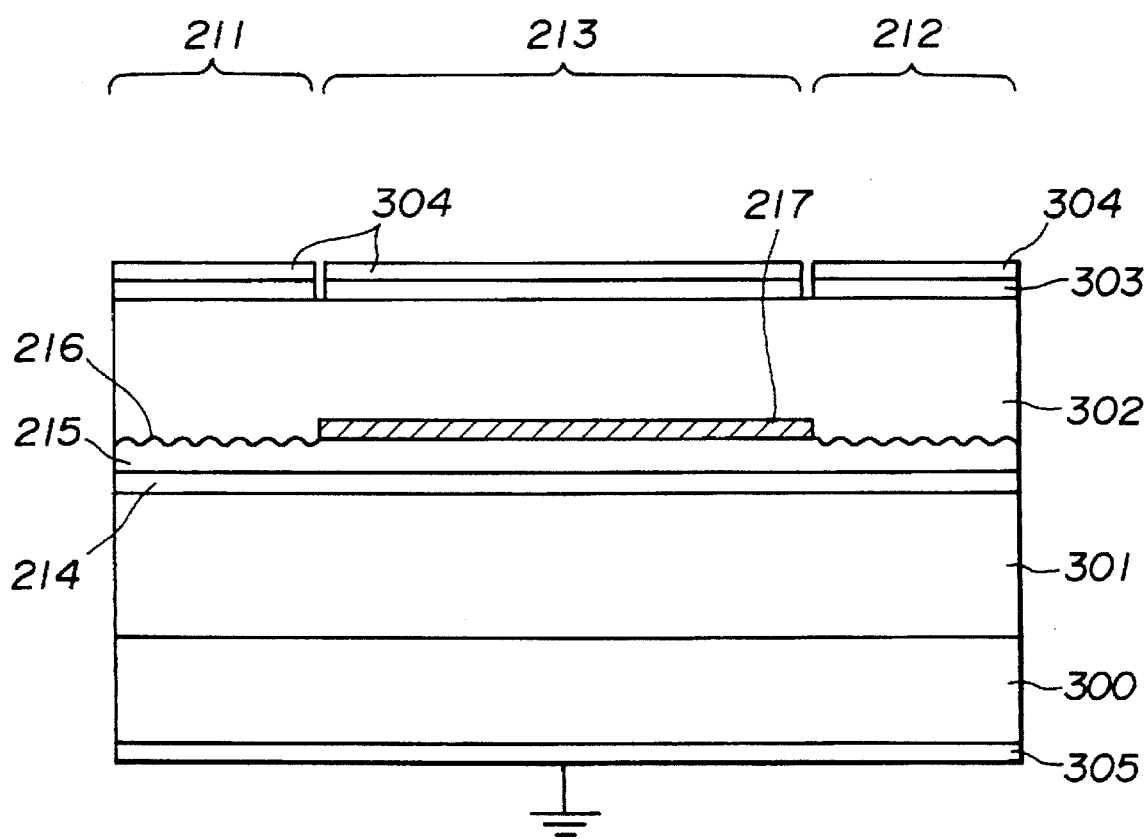
FIG. 6 is a cross-sectional view illustrating a third embodiment of an oscillation polarization mode selective semiconductor laser according to the present invention.

In FIG. 6, reference numeral 300 designates an n-type InP substrate. Reference numeral 301 designates an n-type InP clad layer. Reference numeral 214 designates the above-described n-type InGaAsP light waveguide layer. Reference numeral 215 designates the above-described InGaAsP grating layer whose refractive index is lower than that of the waveguide layer 214. Reference numeral 216 designates the above-described grating of a fine pitch for causing Bragg reflection. Reference numeral 217 designates the above-described active layer of a strained super-lattice structure which consists ten pairs of undoped $In_{0.53}Ga_{0.47}As$ layers (thickness is 5 nm) and $In_{0.28}Ga_{0.72}As$ layers (thickness is 5 nm) layers. Reference numeral 302 designates a p-type InP clad layer. Reference numeral 303 designates a p-type $In_{0.59}Ga_{0.41}As_{0.9}P_{0.1}$ contact layer. Reference numeral 304 designates the above p-side Cr/AuZnNi/Au electrode layers which are separated by separation grooves formed by removing the contact layer 303. Reference numeral 305 designates an n-side AuGeNi/Au electrode layer formed on the bottom surface of the substrate 300. The active layer 217 has a tensile strained multiple quantum well structure, and the transition energy between the level of heavy holes in the valence band and the ground level of electrons in the conduction band ($E_{hh0}-E_{e0}$) is made equal to the transition energy between the level of light holes in the valence band and the ground level of electrons in the conduction band ($E_{1h0}-E_{e0}$). Therefore, when compared with a non-strained super-lattice, the gain for the TM mode is larger and the light emission spectra for the TE mode and the TM mode approximately overlap with a central wavelength of 1.56 μm. The pitch of the grating 216 is set to 0.25 μm so that the Bragg wavelength due to the presence of the grating 216 approximately coincides with the gain central wavelength.

Therefore, when the coupling wavelength for the TM mode in the active directional coupler region 213 is tuned so as to include the Bragg wavelength (here, 1.56 μm) in the Bragg reflector regions 211 and 212 as illustrated in FIG. 7B, the coupling wavelength for the TE mode is necessarily shifted to a side sufficiently longer than the Bragg wavelength and no coupling occurs in the TE mode. In this state, the laser oscillates in the TM mode.

In contrast to the above, when current injected into the active directional coupler region 213 is controlled and the TE mode is coupled to the Bragg wavelength in the Bragg reflector regions 211 and 212 as illustrated in FIG. 7C, the laser oscillates in the TE mode under the same mechanism. Thus, the switching between the TE mode and the TM mode is performed by the control of current. The Bragg wavelengths for the TE mode and the TM mode in the Bragg reflector regions 211 and 212 are both close to 1.56 μm, but this value varies slightly depending on device structures, such as the lateral confinement structure of the waveguide and the layer composition. Generally, the range in variation is approximately 3 nm to 6 nm. In contrast thereto, the coupling band width in the active directional coupler region 213 is about 20 nm which can sufficiently contain the variation of the Bragg wavelength. Therefore, even if the oscillation wavelength in the Bragg reflector regions 211 and 212 is changed, the coupling efficiency in the active directional coupler region 213 is barely influenced.

This embodiment also can be used in systems as illustrated in FIGS. 3 and 4, similar to the first embodiment.

Fourth Embodiment

Figure 8:
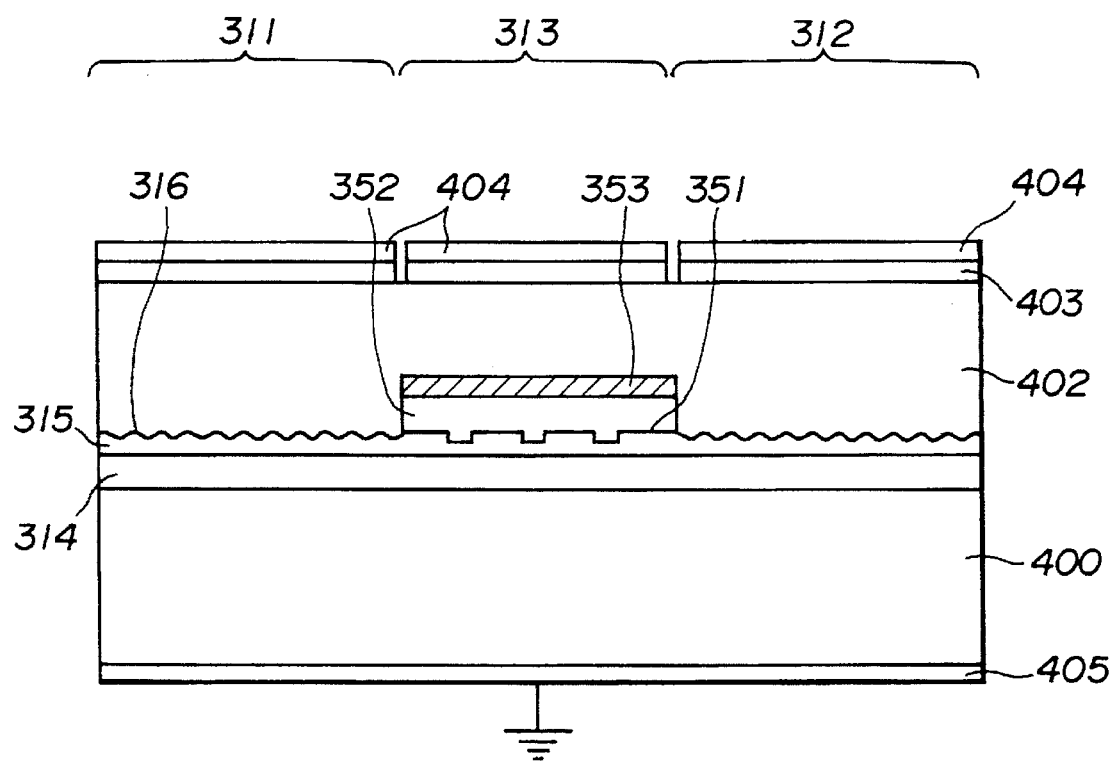
FIG. 8 is a cross-sectional view illustrating a fourth embodiment of an oscillation polarization mode selective semiconductor laser according to the present invention.

A fourth embodiment of the present invention will be described with reference to FIG. 8.

In the fourth embodiment, the structure of Bragg reflector regions 311 and 312 is the same as that of the third embodiment, and a grating 351 of a relatively coarse pitch is formed in an active directional coupler region 313 to further strengthen the wavelength selectivity (or polarization mode selectivity) in the active directional coupler region 313. Further, in this embodiment, on the grating 351, an InGaAsP intermediate clad layer 352, whose refractive index is different from that of a grating layer 315, is formed, and an active layer 353 is deposited on the intermediate clad layer 352. The active layer 353 is comprised of InGaAs which is symmetrical with respect to longitudinal and lateral directions (the active layer 217 of the third embodiment may be adopted), and has similar gains for the TE mode and the TM mode. The pitch of a grating 316 in the Bragg reflector regions 311 and 312 and so forth are the same as those of the third embodiment.

In FIG. 6, reference numeral 400 designates an n-type InP substrate. Reference numeral 402 designates a p-type InP clad layer. Reference numeral 403 designates a p-type contact layer. Reference numeral 404 designates p-side electrode layers which are separated by separation grooves formed by removing the contact layer 403. Reference numeral 405 designates an n-side electrode layer formed on the bottom surface of the substrate 400.

The coupling wavelength $\lambda_{DC}$ is represented by:

$$\lambda_{DC}=|N_{ef\!f}^{(w)}-N_{ef\!f}^{(a)}|\Lambda_{DC}$$

where $N_{ef\!f}^{(w)}$ and $N_{ef\!f}^{(a)}$ are effective refractive indices for propagation modes which have central intensities at a waveguide layer 314 and the active layer 353, respectively, and $\Lambda_{DC}$ is the pitch of the coarse grating 351.

The coupling wavelength, due to the presence of the grating 351, has a large polarization sensitivity, and the coupling wavelengths for the TE mode and the TM mode normally differ from each other by about 30 nm. Therefore, when tuning is performed by injecting current into the active directional coupler region 313 so that the coupling wavelength for the TE mode in the active directional coupler region 313 includes the Bragg wavelength (here, 1.56 μm) in the Bragg reflector regions 311 and 312, the coupling wavelength for the TM mode necessarily approaches 1.53 μm.

Thus, when currents are injected through the electrode, the active layer 353 is excited and spontaneous emission light occurs. Here, only the TE mode is selectively transferred and coupled to the Bragg reflector regions 311 and 312, since only the TE mode is selectively coupled in the active directional coupler region 313. In the Bragg reflector regions 311 and 312, strong reflection occurs at the Bragg wavelength, and consequently oscillation in the TE mode occurs at the Bragg wavelength determined by the Bragg reflector regions 311 and 312.

Next, when the injection current into the active directional coupler region 313 is changed so that the TM mode is coupled to the Bragg wavelength in the Bragg reflector regions 311 and 312, laser oscillation in the TM mode occurs in the same manner. Thus, the oscillation switching between the TE mode and the TM mode and wavelength control can be performed, similar to the third embodiment, by controlling the current injected into the active directional coupler region 313.

Also in this embodiment, if one of the reflector means is a reflective end surface, resonance is effected between the Bragg reflector region and the reflective end surface of an outer end facet of the active layer.

In this embodiment, since the phase matching, due to the presence of the grating 351, is used, the fabrication process becomes a little more complicated (the grating must be formed) than the formation of an asymmetrical directional coupler, as described in the third embodiment. However, the coupling bandwidth is further limited due to the presence of the grating 351, and stronger wavelength selectivity is attained. As a result, the length of the active directional coupler region 313 becomes small, and hence the switching of the polarization mode can be effected by a smaller change in current. The operation principle is the same as that of the third embodiment.

This embodiment also can be used in systems as illustrated in FIGS. 3 and 4, similar to the first embodiment.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the following claims.

What is claimed is:

1. A semiconductor laser comprising:
   a semiconductor laser structure, including an active layer, in which light in both of two mutually-perpendicular polarization modes can be excited;
   first and second reflecting means for reflecting the light waves, at least one of said first and second reflecting means comprising a distributed reflector which determines first and second reflection wavelengths for the two mutually-perpendicular polarization modes;
   coupling means for coupling said semiconductor laser structure and said first and second reflecting means for either of the respective light waves in the two mutually-perpendicular polarization modes at first and second coupling wavelengths, which substantially coincide with the first and second reflection wavelengths, respectively, so that either of the light of the respective two mutually-perpendicular polarization modes at the first and second reflection wavelengths is selectively propagated along a cavity comprised of said semiconductor laser structure and said first and second reflecting means; and
   control means for controlling said coupling means so that said coupling means selects one of the two mutually-perpendicular polarization modes at the first and second coupling wavelengths to cause the light to oscillate in one of the two mutually-perpendicular polarization modes at the first and second reflection wavelengths.

2. A semiconductor laser according to claim 1, wherein said first reflecting means comprises a distributed feedback grating reflector and said coupling means comprises a directional coupler.

3. A semiconductor laser according to claim 2, wherein said second reflecting means comprises a reflective facet.

4. A semiconductor laser according to claim 2, wherein said distributed feedback grating reflector includes said active layer.

5. A semiconductor laser according to claim 2, wherein said directional coupler comprises a pair of asymmetrical waveguides.

6. A semiconductor laser according to claim 2, wherein said directional coupler comprises a grating, and wherein the coupling of propagation modes between said laser structure and said first and second reflecting means is assisted by said grating.

7. A semiconductor laser according to claim 5, wherein one of said pair of waveguides of said directional coupler comprises a W-shaped waveguide in which a core layer is surrounded by a clad layer whose refractive index is lower than the refractive index of a clad layer of said semiconductor laser.

8. A semiconductor laser according to claim 2, further comprising a second control means for controlling current injected into said distributed feedback grating reflector to change the first and second reflection wavelengths.

9. A semiconductor laser according to claim 2, wherein respective gains for the two polarization modes in said cavity are approximately equal near the respective first and second reflection wavelength of said distributed feedback grating reflector.

10. A semiconductor laser according to claim 2, wherein said active layer comprises a layer of a multiple quantum well structure into which a tensile strain is introduced and in which a light-hole level in a valence band is substantially equal to a heavy-hole level in the valence band.

11. A semiconductor laser according to claim 1, wherein at least one of said first and second reflecting means comprises a distributed Bragg reflector and said coupling means comprises an active directional coupler which includes said active layer.

12. A semiconductor laser according to claim 11, wherein said first and second reflecting means respectively comprise distributed Bragg reflectors.

13. A semiconductor laser according to claim 11, wherein said first reflecting means comprises a distributed Bragg reflector and said second reflecting means comprises a reflective facet.

14. A semiconductor laser according to claim 11, wherein said active directional coupler comprises said active layer and a waveguide layer.

15. A semiconductor laser according to claim 11, wherein said active directional coupler comprises a grating, and wherein the coupling of propagation modes between said laser structure and said first and second reflecting means is assisted by a phase matching by said grating.

16. A semiconductor laser according to claim 11, further comprising a second control means for controlling current injected into said distributed Bragg reflector to change the first and second reflection wavelengths.

17. A semiconductor laser according to claim 11, wherein respective gains for the two polarization modes in said cavity are approximately equal near a Bragg wavelength of said distributed Bragg reflector.

18. A semiconductor laser according to claim 11, wherein said active layer comprises a layer of a multiple quantum well structure into which a tensile strain is introduced and in which a light-hole level in a valence band is equal to a heavy-hole level in the valence hand.

19. A semiconductor laser according to claim 1, wherein the first and second coupling wavelengths respectively include the first and second reflection wavelengths.

20. An optical communication method for transmitting a signal from a transmitter to a receiver through an optical transmission line, said method comprising the steps of:

modulating the polarization mode of light output from a semiconductor laser between two mutually-perpendicular polarization modes by controlling current injected into the semiconductor laser, the semiconductor laser comprising:
- a semiconductor laser structure including an active layer, in which light in both of the two mutually-perpendicular polarization modes can be excited;
- first and second reflecting means for reflecting the light waves, at least one of the first and second reflecting means comprising a distributed reflector which determines first and second reflection wavelengths for the two mutually-perpendicular polarization modes;
- coupling means for coupling the semiconductor laser structure and the first and second reflecting means for either of the respective light waves in the two mutually-perpendicular polarization modes at first and second coupling wavelengths, which substantially coincide with the first and second reflection wavelengths, respectively, so that either of the light of the respective two mutually-perpendicular polarization modes at the first and second reflection wavelengths is selectively propagated along a cavity comprised of the semiconductor laser structure and the first and second reflecting means; and
- control means for controlling the coupling means so that the coupling means selects one of the mutually-perpendicular polarization modes at the first and second coupling wavelengths to cause the light to oscillate in one of the two mutually-perpendicular polarization modes at the first and second reflection wavelengths;

selecting only the light output in one of the two mutually-perpendicular polarization modes to create an amplitude-modulated signal; and transmitting the amplitude-modulated signal through the optical transmission line.

21. An optical communication method according to claim 20, wherein the wavelength of the amplitude-modulated signal is tuned by controlling current injected into the semiconductor laser, and a signal at a desired wavelength is selectively detected by using a wavelength filter in the receiver.

22. An optical communication method according to claim 20, wherein a plurality of wavelength filters are used to detect selectively signals at respective desired wavelengths to perform wavelength division multiplexing optical communication.

23. An optical communication system for transmitting a signal from a transmitter to a receiver through an optical transmission line, said system comprising:

a semiconductor laser provided in the transmitter, a polarization mode of light output from said semiconductor laser being modulated between two-mutually perpendicular polarization modes by controlling current injected into said semiconductor laser, and said semiconductor laser comprising:
- a semiconductor laser structure, including an active layer, in which light in both of the two mutually-perpendicular polarization modes can be excited;
- first and second reflecting means for reflecting the light waves, at least one of said first and second reflecting means comprising a distributed reflector which determines first and second reflection wavelengths for the two mutually-perpendicular polarization modes;
- coupling means for coupling said smiconductor laser structure and said first and second reflecting means for either of the respective light in the two mutually-perpendicular polarization modes at first and second coupling wavelengths, which substantially coincides with the first and second reflection wavelengths, respectively, so that either of the light of the two mutually-perpendicular polarization modes at the first and second reflection wavelengths is selectively propagated along a cavity comprised of said semiconductor laser structure and said first and second reflecting means; and
- control means for controlling said coupling means so that said coupling means selects one of the two-mutually perpendicular modes at first and second coupling wavelengths to cause the light to oscillate in one of the two mutually-perpendicular polarization modes at the first and second reflection wavelengths; and means for selecting only the light output in one of the two-mutually perpendicular modes so as to create an amplitude-modulated signal, the amplitude-modulated signal being the signal transmitted from the transmitter to the receiver through the optical transmission line.

24. An optical communication system according to claim 23, wherein said semiconductor laser changes the wavelength of the amplitude-modulated signal, and further comprising a wavelength filter provided in the receiver for selectively detecting the signal at a desired wavelength.

25. An optical communication system according to claim 23, wherein a plurality of wavelength filters are used to detect selectively signals at respective desired wavelengths to perform wavelength division multiplexing optical communication.

* * * * *